United States Patent [19]

Hamada et al.

[11] Patent Number: 6,066,804
[45] Date of Patent: May 23, 2000

[54] ELECTRONIC CIRCUIT PACKAGE

[75] Inventors: Kazuya Hamada; Koichi Okamura, both of Tokyo, Japan

[73] Assignee: Mitsubishi Denki Kabushiki Kaisha, Tokyo, Japan

[21] Appl. No.: 09/161,676

[22] Filed: Sep. 29, 1998

[30] Foreign Application Priority Data

May 13, 1998 [JP] Japan .................................. 10-130735

[51] Int. Cl.⁷ .................................................. H01L 23/28
[52] U.S. Cl. ........................ 174/52.2; 257/687; 257/701; 257/787; 439/721; 439/723; 439/709
[58] Field of Search ................................ 174/35 R, 52.2; 257/687, 701, 787; 439/721, 723, 709

[56] References Cited

U.S. PATENT DOCUMENTS

| 5,233,130 | 8/1993 | Nishino ................................... 174/52.2 |
| 5,619,012 | 4/1997 | Casali et al. ............................ 174/52.2 |

FOREIGN PATENT DOCUMENTS 3-46823  4/1991  Japan .

Primary Examiner—William A. Cuchlinski, Jr.
Assistant Examiner—Ronnie Mancho
Attorney, Agent, or Firm—Sughrue, Mion, Zinn, Macpeak & Seas, PLLC

[57] ABSTRACT

An electronic circuit package is provided in which a substrate accommodating chamber for accommodating a circuit substrate is formed in a case made of resin. The case has a plurality of terminals fixed thereto each having an internal connecting portion extending in parallel with the substrate. An electronic circuit on the circuit substrate is connected through a plurality of leads to the internal connecting portions. Substrate partitioning ribs for partitioning the internal connecting portions and the circuit substrate are integrally formed on the bottom surface of the substrate accommodating chamber. A terminal partitioning rib for partitioning adjacent internal connecting portions is also integrally formed on the bottom surface of the substrate accommodating chamber.

5 Claims, 3 Drawing Sheets

ELECTRONIC CIRCUIT PACKAGE

BACKGROUND OF THE INVENTION

1. Field of the Invention

The present invention relates to an electronic circuit package having a circuit substrate on which an electronic circuit is formed, such as an ignition control circuit for an internal combustion engine, and a case for accommodating the circuit substrate.

2. Description of the Related Art

FIG. 5 is a plan view showing an example of a conventional electronic circuit package; and FIG. 6 is a cross-sectional view taken along the line VI—VI of FIG. 5. In the figures, a connector unit 1a for external connection and a substrate accommodating chamber 1b are formed in a case 1 made of resin. A circuit substrate 2 is fixed onto a bottom surface 1c of the substrate accommodating chamber 1b. An electronic circuit (not shown) is formed on the circuit substrate 2, and a plurality of electronic components (not shown) are mounted thereon.

A plurality of terminals 3 are integrally formed so as to be fixed in the case 1. The respective terminals 3 each comprise an external connecting portion 3a located in the connector unit 1a and an internal connecting portion 3b located in the substrate accommodating chamber 1b. The internal connecting portions 3b are formed by bending the end portions of the terminal 3 so that they extend perpendicular with respect to the bottom surface 1c of the substrate accommodating chamber 1b and the substrate 2.

The electronic circuit formed on the circuit substrate 2 is electrically connected to the terminals 3 by a plurality of leads 4. The respective leads 4 each include a first end portion 4a soldered on the circuit substrate 2 and a second end portion 4b welded to the internal connecting portion 3b of the terminal 3.

With such an arrangement of the electronic circuit package, after the circuit substrate 2, with the leads 4 soldered thereon, has been fixed in the interior of the substrate accommodating chamber 1b, the second end portions 4b of the leads 4 are resistance welded to the internal connecting portions 3b of the terminals 3. By employing the above method in which the leads 4 are connected to the terminals 3 by means of resistance welding, not soldering, the strength of the connecting portion becomes stable, which makes it possible to improve reliability, as well as perform assembly with simple equipment.

FIG. 7 is a cross-sectional view showing another example of a conventional electronic circuit package. This example shows that a circuit substrate 2 is coated with a resin 5 and a substrate accommodating chamber 1b is sealed by a cover 6. With such an arrangement in which the circuit substrate 2 is coated with the resin 5, it is possible to prevent welding chips, generated when leads 4 are resistance-welded to terminals 3, from flying onto the circuit substrate 2 and short circuiting the electronic circuit. The cover 6 is attached to the top of the case 1 after the above-mentioned resistance welding.

FIG. 8 is a cross-sectional view showing still another example of a conventional electronic circuit package. In this example, a circuit substrate 2 is coated with a resin 5, leads 4 are resistance-welded to terminals 3, and then a resin 7 is changed into a substrate accommodating chamber 1b.

With the conventional electronic circuit packages having the above arrangements, since inner connecting portions 3b of the terminals 3 extend in a direction perpendicular to the substrate 2 and the welding portions are located above the circuit substrate 2, there is a fear that welding chips will fly onto the circuit substrate 2. Also, in order to avoid short circuits caused by flying welding chips, the circuit substrate 2 must be coated with the resin 5. Consequently, corresponding equipment and/or processes are required.

Further, conventionally, the leads 4 must be welded to the terminals 3 above the surface of the protective resin 5. Additionally, in order to prevent welding failure due to the resin 5 adhering to the welding surface, some clearance is required between the welded portions and the upper surface of the resin 5. Therefore, the height (thickness) of the package, that is, the vertical direction shown in FIG. 6 will be of a larger dimension. Such a large height dimension of the package requires a large amount of resin 7 to fill the package, as illustrated in FIG. 8, resulting in increased costs.

SUMMARY OF THE INVENTION

The present invention has been made to solve the above-mentioned problems, and therefore it is an object of the present invention to provide an electronic circuit package with a reduced height dimension, while preventing short circuiting of the electronic circuit caused by welding chips produced when the leads are welded to the terminal.

To this end, according to one aspect of the present invention, there is provided an electronic circuit package comprising: a case made of resin having a connector unit for external connection and a substrate accommodating chamber formed therein; a circuit substrate arranged in the substrate accommodating chamber and having an electronic circuit formed thereon; a plurality of terminals each having an external connecting portion located in the connector unit, an internal connecting portion located in the substrate accommodating chamber and extending in parallel with the circuit substrate, the plurality of terminals being fixed in the interior of the case; a plurality of leads each having a first end portion electrically connected to the electronic circuit and a second end portion welded to the internal connecting portion; and a substrate partition rib formed in the substrate accommodating chamber, for partitioning the circuit substrate and the internal connecting portion.

DETAILED DESCRIPTION OF THE PREFERRED EMBODIMENTS

Hereinbelow, the detailed description of the preferred embodiments of the present invention will be made with reference to the accompanying drawings.

First Embodiment

Figure 1:
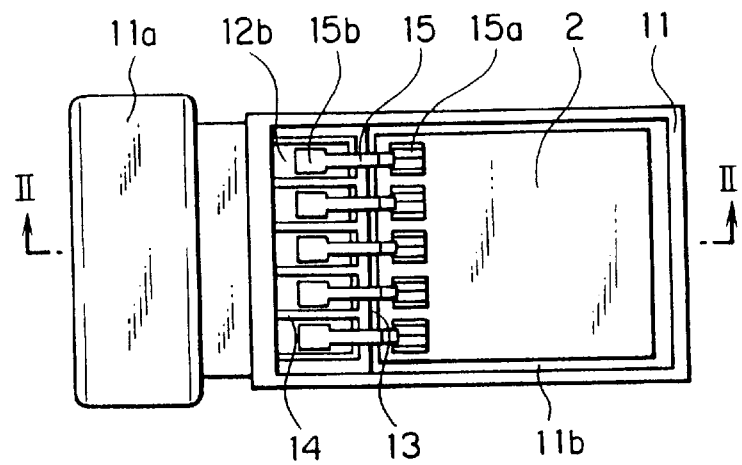
FIG. 1 is a plan view showing an example of an electronic circuit package according to a first embodiment of the present invention.
Figure 2:
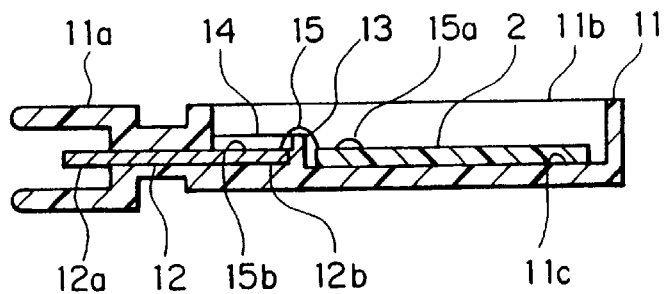
FIG. 2 is a cross-sectional view taken along the line II—II of FIG. 1.

FIG. 1 is a plan view showing an example of an electronic circuit package according to a first embodiment of the present invention; and FIG. 2 is a cross-sectional view taken along the line II—II of FIG. 1. In the figures, a connector unit 11a for external connection and a substrate accommodating chamber 11b are formed in a case 11 made of resin. A circuit substrate 2 is fixed onto a bottom surface 11c of a substrate accommodating chamber 11b. An electronic circuit (not shown) is formed on the circuit substrate 2, and a plurality of electronic components (not shown) are mounted thereon.

A plurality of terminals 12 are integrally formed so as to be fixed in the case 11. Each terminal 12 has an external connecting portion 12a located in the connector unit 11a and an internal connecting portion 12b located in the substrate accommodating chamber 11b, respectively. The internal connecting portions 12b are not bent and extend in parallel with the substrate 2 along the bottom surface 11c of the substrate accommodating chamber 11b.

A substrate partitioning rib 13 for partitioning the circuit substrate 2 and the internal connecting portions 12b, and terminal partitioning ribs 14 for partitioning adjacent internal connecting portions 12b are provided in the substrate accommodating chamber 11b. The partitioning ribs 13 and 14 are integrally molded to the case 11 so as to protrude from the bottom surface 11c.

The electronic circuit formed on the circuit substrate 2 is electrically connected to the terminals 12 by a plurality of leads 15. Each lead 15 has a first end portion 15a soldered on the circuit substrate 2 and a second end portion 15b welded to the internal connecting portion 12b of the terminal 12, respectively. Each lead 15 is also curved in advance so as to extend over the substrate partition rib 13.

In such an arrangement of the electronic circuit package, the circuit substrate 2, with the leads 15 soldered thereon, is fixed in the interior of the substrate accommodating chamber 11b. Thereafter, the second end portions 15b of the leads 15 are resistance welded to the internal connecting portions 12b of the terminals 12. By employing the above method in which the leads 15 are connected to the terminals 12 by means of resistance welding, not soldering, the strength of the connecting portions become stable, which makes it possible to improve reliability, as well as perform assembly with simple equipment.

Further, because the partitioning ribs 13 and 14 are formed so as to surround the welding portions, welding chips are prevented from flying over the circuit substrate 2 and the adjacent terminals 12, and hence short circuits in the electronic circuit or among the terminals are prevented. As a result, the circuit substrate 2 does not have to be coated with a resin before welding. Further, the internal connecting portions 12b of the terminals 12 may be arranged along the bottom surface 11c, so that the height dimension of the substrate accommodating chamber 11b may be reduced, and the height dimension of the entire package may be made smaller. As a result, layout freedom may be improved. Further, the visual inspection for and the work of removing welding chips conducted in the prior art may be omitted or simplified. Moreover, the equipment for and process of assembling the package can be simplified to reduce costs.

Second Embodiment

Figure 3:
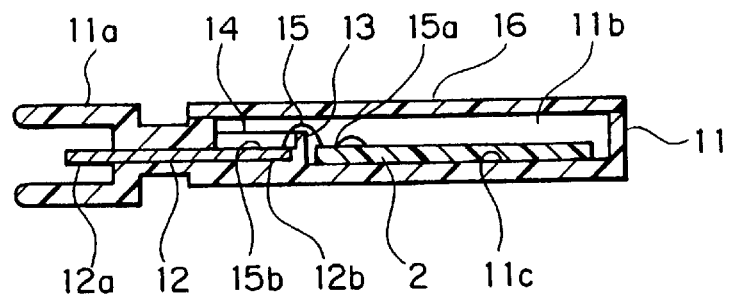
FIG. 3 is a cross-sectional view showing an electronic circuit package according to a second embodiment of the present invention.

FIG. 3 is a cross-sectional view showing an electronic circuit package according to a second embodiment of the present invention. In this example, a cover 16 is provided at the top of the case 11, which seals the substrate accommodating chamber 11b. With such an arrangement, the circuit substrate 2 can be protected without changing the resin into the substrate accommodating chamber 11.

Third Embodiment

Figure 4:
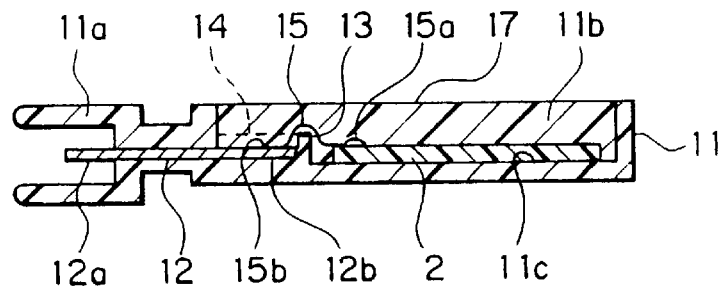
FIG. 4 is a cross-sectional view showing an electronic circuit package according to a third embodiment of the present invention.
Figure 5:
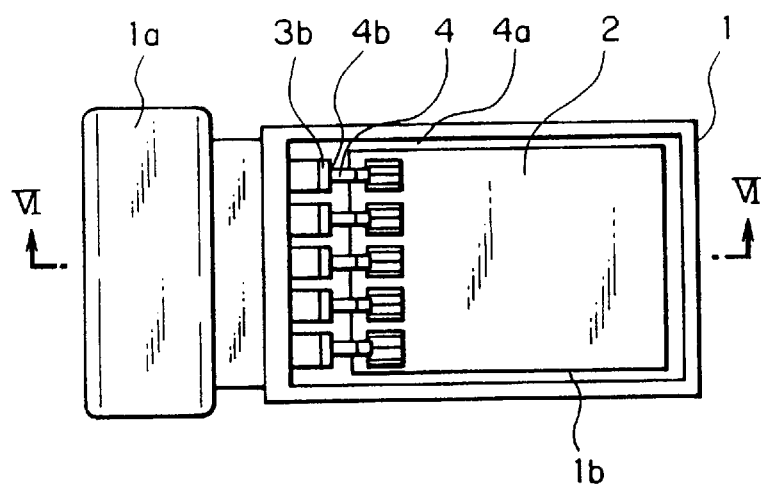
FIG. 5 is a plan view showing an example of a conventional electronic circuit package.
Figure 6:
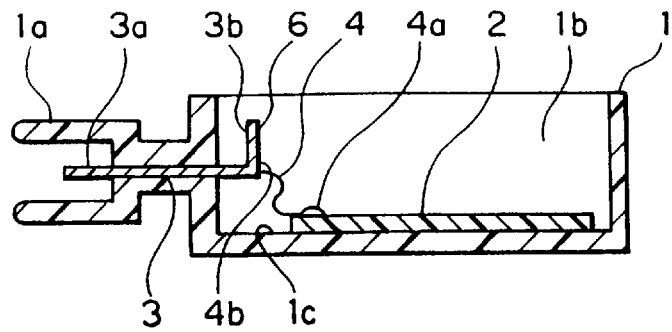
FIG. 6 is a cross-sectional view taken along the line VI—VI of FIG. 5.
Figure 7:
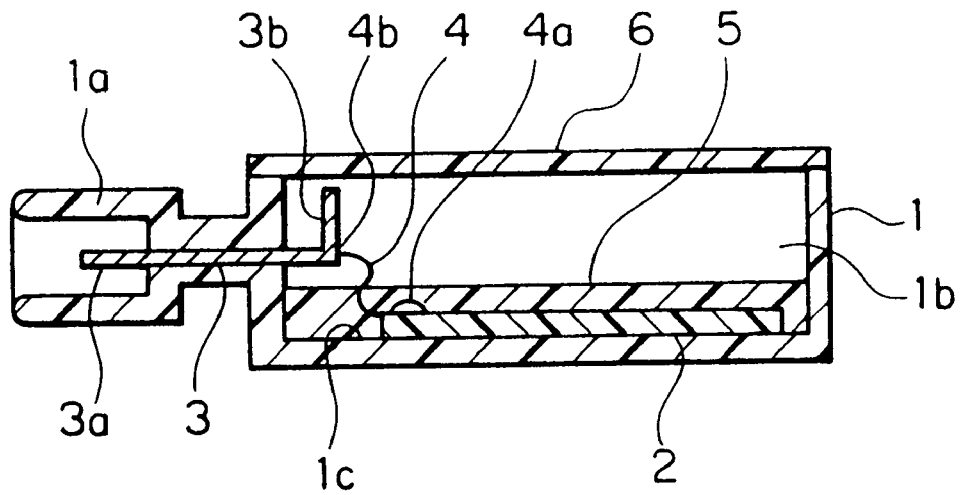
FIG. 7 is a cross-sectional view showing another example of a conventional electronic circuit package.
Figure 8:
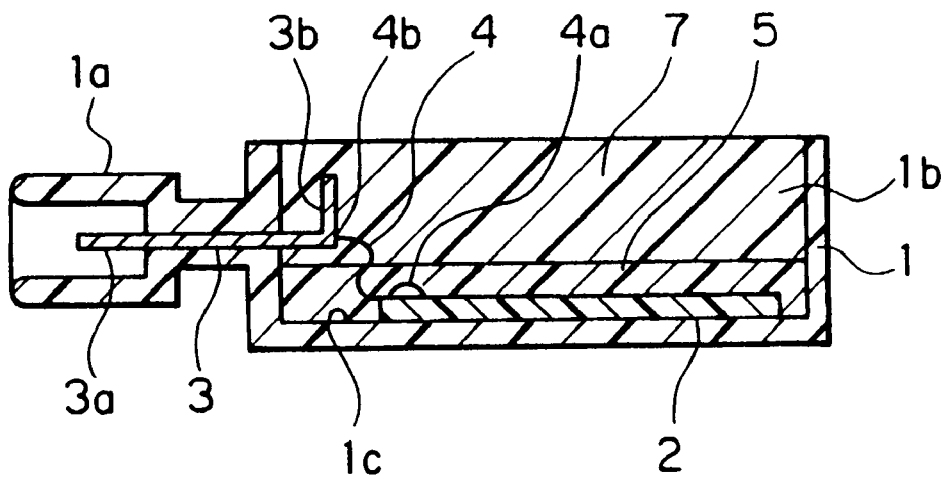
FIG. 8 is a cross-sectional view showing still another example of a conventional electronic circuit package.

FIG. 4 is a cross-sectional view showing an electronic circuit package according to a third embodiment of the present invention. In this example, a resin 17 for encapsulation is changed into the substrate accommodating chamber 11b. With such an arrangement, the circuit substrate 2 can be more surely protected. Further, the substrate accommodating chamber 11b has a smaller height dimension, allowing the amount of the resin 17 changed to be reduced.

It should be noted that according to the above embodiments of the present invention, terminal partition ribs 14 are formed among the adjacent internal connecting portions 12b. However, if there is sufficient space between adjacent terminals 12, then the terminal partition ribs 14 may be omitted.

Also, in the above-described embodiments of the present invention, though the partition ribs 13 and 14 are integrally formed in the case 11, other materials may be fixed thereto by means of an adhesive or the like.

It is, therefore, evident that there has been provided in accordance with the present invention, a package which fully satisfies the aims and advantages heretofore mentioned. While this invention has been described in conjunction with preferred embodiments thereof, it is also evident that many modifications and variations will be apparent to those skilled in the art. Accordingly, the present invention is intended to encompass all such modifications and variations that fall within the spirit and scope of the appended claims.

What is claimed is:

1. An electronic circuit package comprising:
   a case made of resin having a connector unit for external connection and a substrate accommodating chamber formed therein;
   a circuit substrate arranged in said substrate accommodating chamber and having an electronic circuit formed thereon;
   a plurality of terminals each having an external connecting portion located in said connector unit, an internal connecting portion located in said substrate accommodating chamber and extending in parallel with said circuit substrate, said plurality of terminals being fixed in the interior of said case;
   a plurality of leads each having a first end portion electrically connected to said electronic circuit and a second end portion welded to said internal connecting portion; and
   a substrate partitioning rib formed in said substrate accommodating chamber, for partitioning said circuit substrate and said internal connecting portion.

2. An electronic circuit package as claimed in claim 1, further comprising a terminal partitioning rib formed in said substrate accommodating chamber, for partitioning adjacent ones of said internal connecting portions.

3. An electronic circuit package as claimed in claim 2, wherein said substrate partitioning rib and said terminal partition rib are integrally formed in said case.

4. An electronic circuit package as claimed in claim 1, wherein said leads are curved in advance so as to extend over said substrate partitioning rib.

5. An electronic circuit package as claimed in claim 1, wherein said substrate accommodating chamber is filled with a resin.

\* \* \* \* \*